(12) United States Patent
Honan et al.

(10) Patent No.: US 12,249,522 B2
(45) Date of Patent: Mar. 11, 2025

(54) PROCESSING CHAMBER WITH ANNEALING MINI-ENVIRONMENT

(71) Applicant: Applied Materials, Inc., Santa Clara, CA (US)

(72) Inventors: Michael Honan, Danvers, MA (US);
David Blahnik, Round Rock, TX (US);
Robert Brent Vopat, Austin, TX (US);
Jeffrey Blahnik, Volente, TX (US);
Charles Carlson, Cedar Park, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/244,041

(22) Filed: Sep. 8, 2023

(65) Prior Publication Data
US 2023/0420275 A1 Dec. 28, 2023

Related U.S. Application Data

(62) Division of application No. 16/665,343, filed on Oct. 28, 2019, now Pat. No. 11,791,176.
(Continued)

(51) Int. Cl.
*H01L 21/67* (2006.01)
*C30B 33/02* (2006.01)
(Continued)

(52) U.S. Cl.
CPC ........ *H01L 21/67109* (2013.01); *C30B 33/02* (2013.01); *C30B 35/00* (2013.01);
(Continued)

(58) Field of Classification Search
CPC .......... C30B 33/02; C30B 35/00; F27D 7/02; H01L 21/324; H01L 21/67103;
(Continued)

(56) References Cited

U.S. PATENT DOCUMENTS 5,167,716 A * 12/1992 Boitnott ............ H01L 21/67115
118/724
5,273,423 A 12/1993 Shiraiwa
(Continued)

FOREIGN PATENT DOCUMENTS

| CN | 105940481 A | 9/2016 |
| JP | 2001007038 A | 1/2001 |

(Continued)

OTHER PUBLICATIONS

"PCT International Search Report and Written Opinion in PCT/US2019/058275 dated Feb. 17, 2020, 12 pages".

*Primary Examiner* — Matthew J Song
(74) *Attorney, Agent, or Firm* — Servilla Whitney LLC

(57) ABSTRACT

Apparatus and methods to process one or more wafers are described. The apparatus comprises a chamber defining an upper interior region and a lower interior region. A heater assembly is on the bottom of the chamber body in the lower interior region and defines a process region. A wafer cassette assembly is inside the heater assembly and a motor is configured to move the wafer cassette assembly from the lower process region inside the heater assembly to the upper interior region.

11 Claims, 8 Drawing Sheets

Related U.S. Application Data

(60) Provisional application No. 62/751,680, filed on Oct. 28, 2018.

(51) Int. Cl.

| | | |
|---|---|---|
| *C30B 35/00* | (2006.01) | |
| *F27D 7/02* | (2006.01) | |
| *H01L 21/324* | (2006.01) | |
| *H01L 21/673* | (2006.01) | |

(52) U.S. Cl.
CPC .............. *F27D 7/02* (2013.01); *H01L 21/324* (2013.01); *H01L 21/67248* (2013.01); *H01L 21/67323* (2013.01)

(58) Field of Classification Search
CPC ........... H01L 21/67109; H01L 21/6719; H01L 21/67248; H01L 21/67303; H01L 21/67306; H01L 21/67309; H01L 21/67323; H01L 21/67748; H01L 21/67757; H01L 21/68742
See application file for complete search history.

(56) References Cited

U.S. PATENT DOCUMENTS

| | | | |
|---|---|---|---|
| 6,048,154 A | 4/2000 | Wytman | |
| 6,246,031 B1 | 6/2001 | Yoo | |
| 2002/0129901 A1 | 9/2002 | Fujikawa et al. | |
| 2004/0045813 A1 | 3/2004 | Kanno et al. | |
| 2007/0243317 A1* | 10/2007 | Du Bois | ............. C23C 16/4583 118/725 |
| 2009/0212014 A1 | 8/2009 | Ohata | |
| 2012/0076936 A1* | 3/2012 | Hirano | ............... C23C 16/45563 118/724 |
| 2012/0103524 A1* | 5/2012 | Chebi | ................... H01J 37/3211 156/345.48 |
| 2012/0186573 A1* | 7/2012 | Jdira | ................. H01L 21/67109 126/58 |
| 2012/0210937 A1* | 8/2012 | Thakur | .................... C23C 16/54 118/725 |
| 2015/0159272 A1 | 6/2015 | Yoon et al. | |
| 2016/0348240 A1 | 12/2016 | Burrows et al. | |
| 2019/0259625 A1 | 8/2019 | Nemani et al. | |
| 2019/0295867 A1 | 9/2019 | Oikawa | |
| 2019/0341281 A1 | 11/2019 | Yamaguchi et al. | |

FOREIGN PATENT DOCUMENTS

| | | |
|---|---|---|
| JP | 2007311724 A | 11/2007 |
| JP | 2011077143 A | 4/2011 |
| JP | 2013038128 A | 2/2013 |
| KR | 19980032491 A | 7/1998 |
| KR | 20120085210 A | 7/2012 |
| KR | 20120099592 A | 9/2012 |
| KR | 20170037678 A | 4/2017 |
| TW | 355827 B | 4/1999 |
| TW | 201411757 A | 3/2014 |
| TW | 201418654 A | 5/2014 |

* cited by examiner

PROCESSING CHAMBER WITH ANNEALING MINI-ENVIRONMENT

CROSS-REFERENCE TO RELATED APPLICATIONS

This application is a Divisional Application of U.S. patent application Ser. No. 16/665,343, filed Oct. 28, 2019, which claims priority to U.S. Provisional Application No. 62/751,680, filed Oct. 28, 2018, the entire disclosures of which are hereby incorporated by reference herein in their entireties.

TECHNICAL FIELD

The present disclosure relates generally to apparatus and methods for processing a wafer. In particular, the disclosure relates to a processing chamber with a mini-environment for annealing a plurality of wafers at high temperatures and high pressures.

BACKGROUND

Annealing chambers typically use seals to isolate the interior of the chamber from the ambient environment or other processing temperatures (for example, when used in a cluster tool). Conventional annealing chambers cannot operate at temperatures above 500° C. due to the failure of the seals. Additionally, high pressure annealing (e.g., ~70 bar) is incompatible with high temperature processing because the combination of pressure and temperature causes failures of sealing components. Components for temperature gauges, pressure gauges, burst disks and dynamic seals, for example, are not available for the extreme temperatures and pressures that are useful for steam annealing.

Therefore, there is a need in the art for apparatus and methods of annealing substrates at high temperatures and pressures.

SUMMARY

One or more embodiments of the disclosure are directed to processing chambers comprising a chamber body having a top, sidewall and bottom defining an upper interior region and a lower interior region. A heater assembly is on the bottom of the chamber body in the lower interior region. The heater assembly comprises a bottom, sidewall and a top defining a process region. A wafer cassette assembly is inside the heater assembly. A motor is configured to move the wafer cassette assembly from the lower interior region inside the heater assembly to the upper interior region.

Additional embodiments of the disclosure are directed to processing chambers comprising a chamber body having a top, sidewall and bottom defining an upper interior region and a lower interior region. The sidewall has a slit valve operable to isolate or allow access to the upper interior region of the chamber body through the sidewall. A heater assembly is on the bottom of the chamber body in the lower interior region. The heater assembly comprises a bottom, sidewall and a top defining a process region within the heater assembly. The sidewall of the heater assembly comprising a double-walled labyrinthine exit flow path to provide fluid communication between the process region within an interior of the heater assembly and the upper interior region of the chamber body. At least one floor heating element is located adjacent the bottom of the heater assembly. At least one sidewall heating element is adjacent the sidewall of the heater assembly. The sidewall heating element extends around a circumference of the sidewall. A wafer cassette assembly is inside the heater assembly. The wafer cassette assembly comprises a plurality of wafer supports positioned to support a wafer during processing. Each of the wafer supports comprises a plurality of wafer support elements spaced along a height of the wafer support. A motor is configured to move the wafer cassette assembly from the interior of the heater assembly to the upper interior region. A steam injection port is in the bottom of the chamber body and the bottom of the heater assembly. The steam injection port provides a fluid path into the process region of the heater assembly. A controller is connected to one or more of the heater assembly, the wafer cassette, the motor, the slit valve in the sidewall of the chamber in the upper interior region or one or more sensors within the upper interior region, the one or more sensors configured to measure one or more of temperature or pressure.

Further embodiments of the disclosure are directed to methods of annealing a plurality of wafers. A plurality of wafers is positioned in a heater assembly within a lower interior portion of a chamber body. The heater assembly comprises a sidewall with a double-walled labyrinthine exit flow path to provide fluid communication between an interior of the heater assembly and an upper interior portion of the chamber body. The plurality of wafers is heated. The chamber body is pressurized to a predetermined pressure by flowing steam into the heater assembly, the steam exiting the heater assembly into the upper interior portion of the chamber body through the double-walled labyrinthine exit flow path in the heater assembly.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
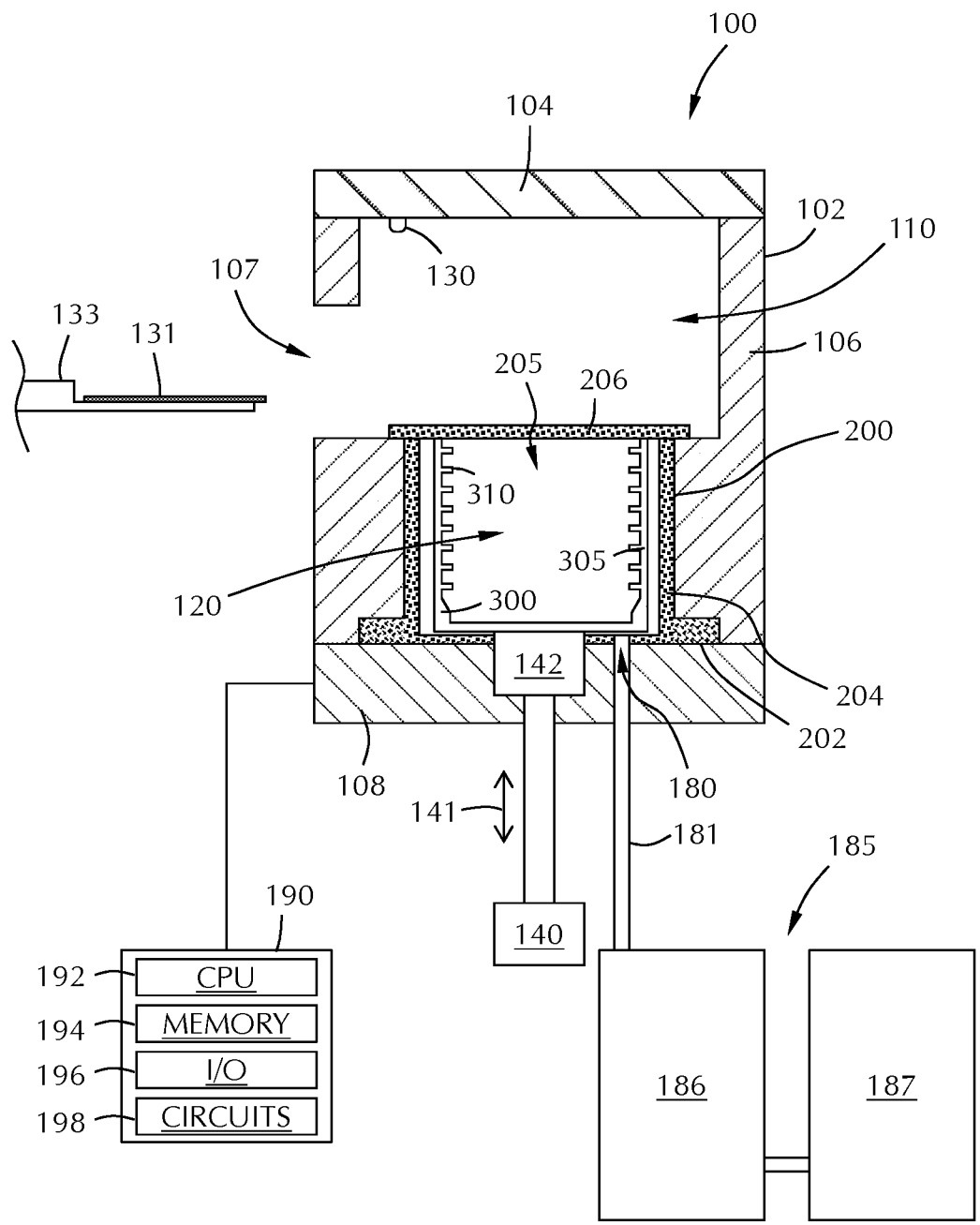
FIG. 1 illustrates a schematic view of a processing chamber with mini environment according to embodiments described herein.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

Embodiments of the disclosure provide processing chambers with mini environments for, amongst other processes, steam annealing. The mini environment isolates the high temperature zone used for processing wafers from the lower temperature capable bulk chamber are. The mini environment is designed to focus heat internally minimizing thermal leakage and providing wafer to wafer and within wafer uniformity at high temperatures.

According to some embodiments, the high temperature and pressure operating environment can isolate the wafer environment from the remainder of the chamber. This isolation allows lower operating temperatures in the bulk environment, allowing a broader selection of chamber components. Components for measuring temperature/pressure and sealing systems cannot operate above 500° C. Some embodiments of the disclosure advantageously provide an isolation system with an operating environment separate from the wafer environment.

Conventional systems cannot operate at these elevated temperatures (greater than 550° C.) and elevated pressures (greater than 50 bar). One or more embodiments of the disclosure provide chambers and methods in which components for pressure gauges, temperature gauges, burst disks, dynamic seals, etc., operate under elevated temperature and pressure conditions. The disclosed systems and methods allow for the use of existing components in a more reasonable operating environment outside of the mini chamber environment.

The steam mini-chamber environment of some embodiments is an isolation system which leverages steam's natural insulating properties. In some embodiments, the steam mini-chamber environment reduces convective flows. In some embodiments, the steam mini-chamber environment focuses energy into the wafer environment. In some embodiments, thermal isolation of the thermal zones enables a broader selection of components and materials by maintaining lower temperatures outside the high temperature zone. The mini environment of some embodiments enables the use of alternate materials while maintaining the same basic structure of conventional chambers.

Referring to the Figures, the mini environment of some embodiments is a thermally isolated volume within the high pressure chamber. The mini environment is created by lowering the wafer exchange mechanism into the lowest position. The lift assembly has several functions and components. Connected to the top of the assembly is a wafer cassette with a top hat cover. The vertical motion of the lift assembly in conjunction with a robot blade provides the means of exchanging wafers at atmosphere. A sealing puck is located at the bottom of the lift assembly. To seal the chamber the lift will lower to the lowest position. In some embodiments, the lower chamber is sealed with a positively pressurized seal puck. In some embodiments, the top hat seals the mini environment when the lift is in the lowest position. At this position the wafers are in the mini environment, the top hat seals the top portion of the environment and the puck rests on the lower ledge sealing the chamber. This creates the sealed internal mini environment along with sealing the main chamber with the puck seal.

In some embodiments, construction of the mini environment optimizes thermal isolation of the wafer environment from the bulk chamber. In one or more embodiments, the thermal insulating properties of steam are used to limit convective flow and create double walls to insulate and stage the environment. In some embodiments, a labyrinthine flow path is created to minimize leakage by creating a torturous path for the steam limiting the flow and losses between the two thermal environments.

In one or more embodiments, the lower section of the environment is raised from the bulk chamber floor and isolated with multi staged quartz barriers for thermal insulation. In some embodiments, the quartz floor is the main feedthroughs for heater power, thermocouples and steam injection. In one or more embodiments, naturally electrically insulating quartz provides a path for live heater wires to the internal environment of the chamber. The wires feed the internal heaters which are hung from quartz hangers in a coil wrapping around the wafer stack. The wires of some embodiments are configured using alternate materials and gauges to achieve specific thermal requirements. An additional coil is positioned at the bottom of the chamber to limit losses through the floor and provide additional heat input. A steam injection is ported directly into the mini environment through the quartz floor. The port terminated below a plenum (second quartz floor) which will provide diffuse flow of steam through perforated holes in the material into the mini environment. The steam injection port is connected directly to the third stage of the triple boiler which ensures dry steam injection. Similar to the live electrical wire feedthrough, thermal couples can be routed from the lower quartz section into the min environment to probe and provide active thermal feedback for the wafer environment.

The mini environment of some embodiments is optimized for future configurations based on changing requirements. In some embodiments, the bulk chamber volume is sized to allow for reversing the heaters to the outside of the environment and replacing the wall material with an IR transparent material. The direct steam injection into mini environment can be continuously feed maintaining a slight differential pressure across the mini environment walls. This configuration might be leveraged to provide an optimized contamination performance with the added complexity of internal pressure management and controls. The design is focused on supporting either configuration based on process needs.

Figure 2:
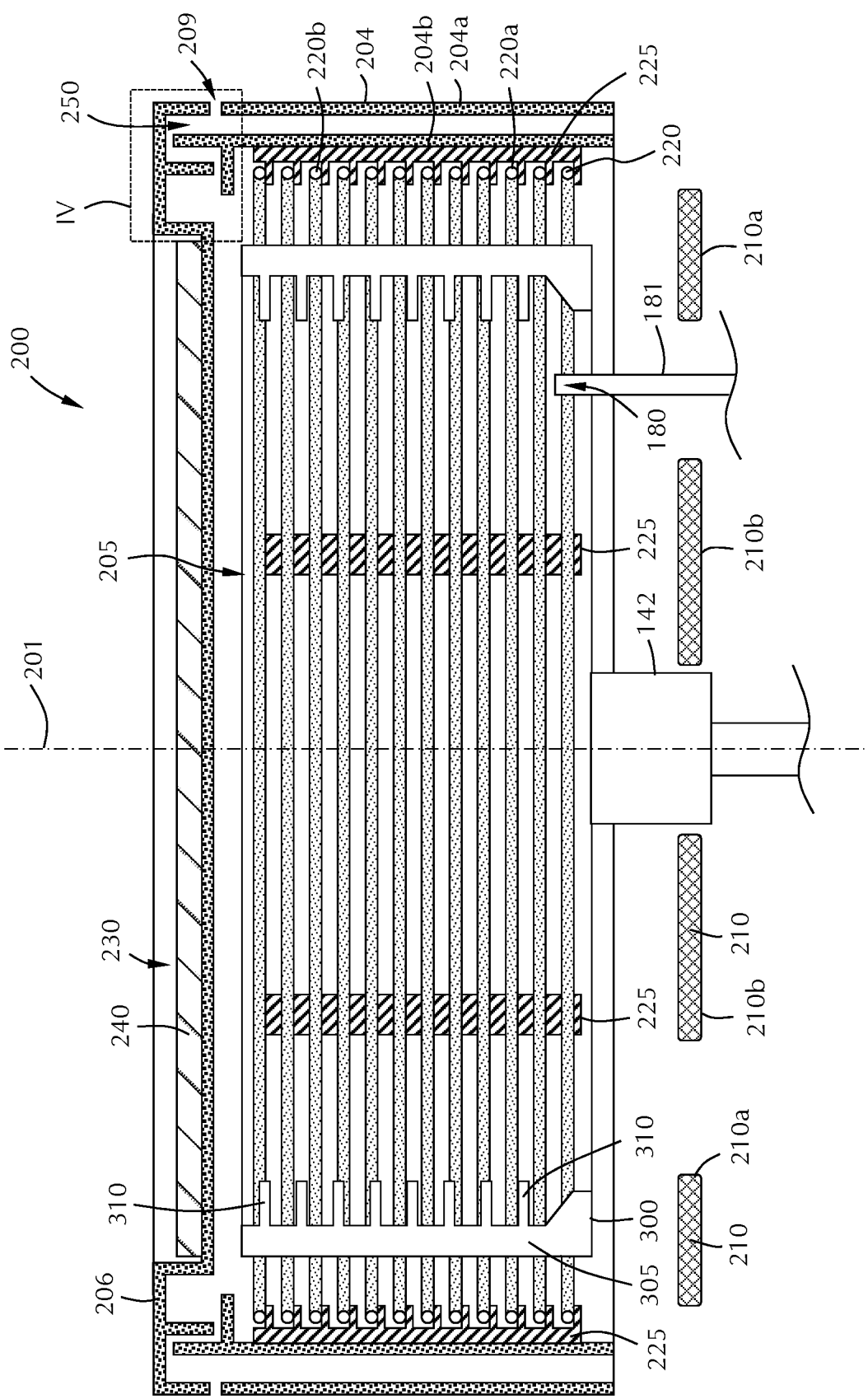
FIG. 2 illustrates a schematic cross-sectional view of a heater assembly for use with a processing chamber mini environment according to one or more embodiments.
Figure 3:
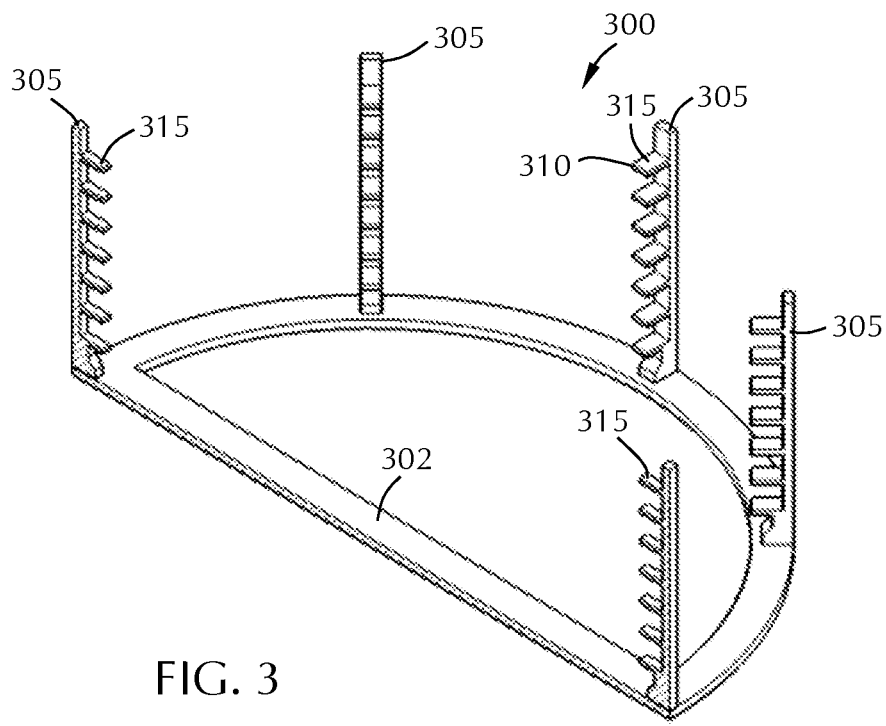
FIG. 3 illustrates a portion of a wafer cassette according to one or more embodiments.

Referring to FIGS. 1 through 3, one or more embodiments of the disclosure are directed to processing chambers 100. The chamber 100 includes a chamber body 102 with a top 104, sidewall 106 and bottom 108. The chamber body 102 defines an upper interior region 110 and a lower interior region 120.

Figure 5A:
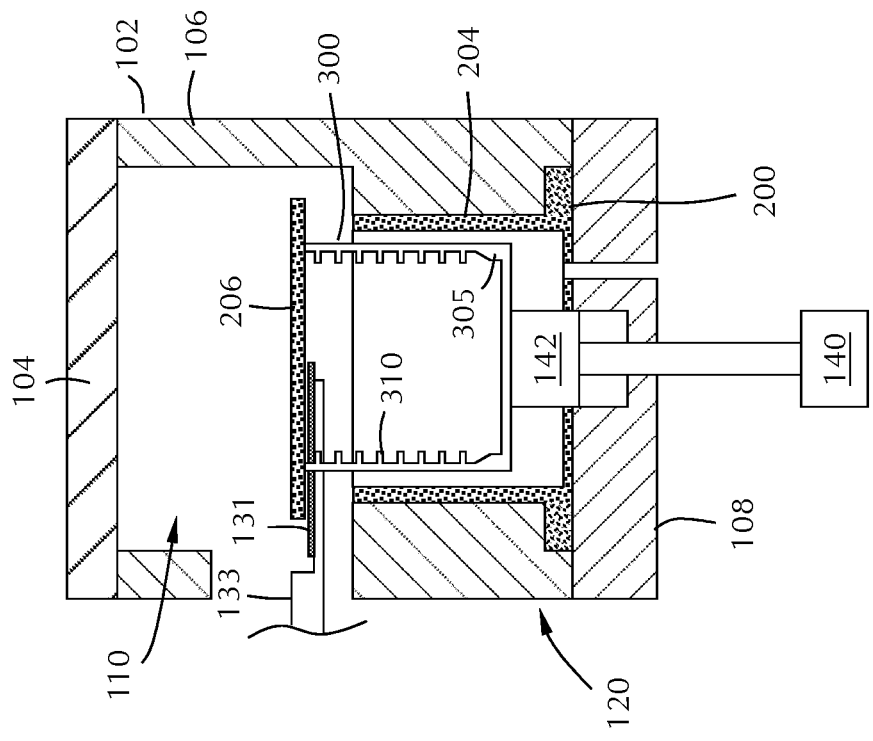
FIGS. 5A through 5H show a cross-sectional schematic view of a processing chamber with mini environment in use according to one or more embodiments.

The sidewall 106 of the chamber body 102 comprises a slit valve 107 to allow a substrate to be loaded or unloaded from the chamber 100. In some embodiments, the slit valve 107 is located in the upper interior region 110 of the chamber body 102 to load and unload wafers from the wafer cassette. FIG. 1 illustrates a wafer 131 on a robot 133 positioned adjacent the open slit valve 107. The illustration shows the slit valve 107 without a door; however, the skilled artisan will recognize that the slit valve 107 of some embodiments has a door that can be opened and closed to isolate the upper interior region 110 from the conditions outside of the processing chamber body 102. (A door 109 closing the slit valve 107 is illustrated in FIG. 5H.)

In some embodiments, the processing chamber 100 includes at least one sensor 130. The at least one sensor 130 of some embodiments is located within the upper interior region 110. In some embodiments, at least one sensor 130 is located within the lower interior region 120. In some embodiments, the at least one sensor 130 is within the upper interior region 110 to measure one or more of temperature or pressure within the upper interior region 110. In some embodiments, at least one sensor is within the lower interior region 120 to measure one or more of temperature or pressure within the lower interior region 120.

A heater assembly 200 is on the bottom 108 of the chamber body 102 in the lower interior region 110 of the processing chamber 100. The heater assembly 200 comprises a bottom 202, sidewall 204 and a top 206 defining a process region 205. In some embodiments, a wafer cassette 300 is positioned inside the heater assembly 200.

In some embodiments, a motor 140 is configured to move the wafer cassette 300 from the lower interior region 120 inside the heater assembly 200 to the upper interior region 110, as will be described in more detail below. The motor 140 of some embodiments is coupled to the wafer cassette 300 or heater assembly 200 through lift connector 142. In some embodiments, the motor 140 is configured to move 141 along an axis perpendicular to the bottom 108 of the processing chamber body 102.

In some embodiments, the heater assembly 200 further comprises a heating element 210 adjacent the bottom 202 of the heater assembly 200. The heater assembly 200 is positioned to heat the wafer cassette 300 and the process region 205 and any wafers 131 loaded in the wafer cassette 300.

In some embodiments, there is one heating element 210 adjacent the bottom 202 of the heater assembly 200. In some embodiments, there is more than one heating element 210 adjacent the bottom 202 of the heater assembly 200. As shown in FIG. 2, there are two radial zone heating elements 210a, 210b. The heating elements 210a, 210b adjacent the bottom 202 of the heater assembly 200 is separated into a plurality of radial zones spaced at different distances from the central axis 201 of the heater assembly 200.

In some embodiments, the heater assembly 200 further comprises a heating element 220 around the sidewall 204. As shown in FIG. 2, the heating element 220 is positioned within the interior process region 205 of the heater assembly 200. In some embodiments, there is one heating element 220 within the interior of the heater assembly 200. In some embodiments, there is a plurality of heating elements 220 adjacent the sidewall 204 within the interior process region 205 of the heater assembly 200. In some embodiments, there are two heating elements 220 adjacent the sidewall. In some embodiments, the heating elements 220 are separated into a plurality of axially spaced zones 220a, 220b, etc. Axial zones are spaced along the length of the central axis 201. In some embodiments, the heating element 220, or plurality of heating elements 220, is positioned on a ceramic wire guide 225 adjacent the sidewall 204 in the process region 205 in the interior of the heater assembly 200. In some embodiments, the heater assembly 200 has at least one sidewall heating element 220 adjacent to and extending around the inner circumference of the sidewall 204.

In some embodiments, the top 206 of the heater assembly 200 is fixed to the sidewalls 204. In some embodiments, the top 206 of the heater assembly 200 is removable from the sidewalls 204. As will be discussed further below with respect to FIGS. 5A through 5H, movement of the wafer cassette 300 from the lower interior region 120 to the upper interior region 110 causes the top 206 of the heater assembly 200 to move or the top 206 and sidewalls 204.

Referring back to FIG. 2, in some embodiments the top 206 of the heater assembly 200 comprises a quartz disc 240. In some embodiments, the quartz disc 240 is a separate component positioned on the surface of the top 206 in a recess 230. In some embodiments, the top 206 of the heater assembly 200 comprises quartz.

FIG. 3 illustrates a cross-sectional isometric view of a wafer cassette 300 in accordance with one or more embodiment of the disclosure. The wafer cassette 300 of some embodiments includes a bottom 302 with a plurality of wafer supports 305 extending from the bottom 302. The wafer supports 305 are spaced at any suitable distance around the periphery of the wafer cassette 300. In some embodiments, the wafer supports 305 are spaced around one half a circle to provide sufficient room for a wafer to be loaded or unloaded from the wafer cassette 300.

The wafer supports 305 comprise a plurality of wafer support elements 310 spaced along the height of the wafer support 305. The wafer support elements 310 have a wafer support surface 315 which is suitably sized to contact a wafer during processing. The wafer support elements 310 of some embodiments are spaced so that the wafer support surfaces 315 of the wafer support elements 310 are in the range of about 1 mm to about 25 mm, or in the range of about 2 mm to about 20 mm, or in the range of about 3 mm to about 18 mm, or in the range of about 4 mm to about 16 mm, or in the range of about 5 mm to about 15 mm.

The wafer supports 305 and wafer support elements 310 are made of any suitable material that can safely contact a wafer. In some embodiments, the wafer supports 305 comprise an oxidation and corrosion resistant material. In some embodiments, the wafer support elements 310 comprise an oxidation and corrosion resistant material. In some embodiments, the wafer supports 305 and wafer support elements 310 are integrally formed from an oxidation and corrosion resistant material.

Figure 4:
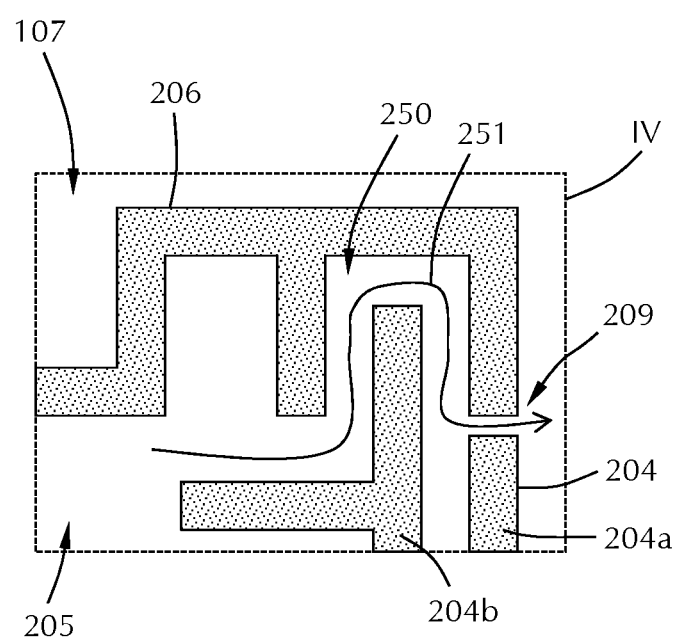
FIG. 4 illustrates portion IV of the heater assembly of FIG. 2.

Referring to FIGS. 2 and 4, some embodiments of the heater assembly 200 have a double wall 204a, 204b. FIG. 4 shows an expanded view of region IV of FIG. 2. A space between the outer wall 204a and inner wall 204b in some embodiments is in the range of about 0.5 mm to about 50 mm, or in the range of about 0.75 mm to about 25 mm, or in the range of about 1 mm to about 20 mm, or in the range of about 2 mm to about 10 mm.

In some embodiments, the sidewall 204 of the heater assembly 200 has a double-walled labyrinthine exit flow path 250. The double-walled labyrinthine flow path 250 provides fluid communication between the process region 205 and the upper interior region 110 of the chamber body 102. FIG. 4 shows an example gas flow 251 exiting the process region 205 and the heater assembly 200. As used in this manner, the term "labyrinthine flow path" refers to a flow path with at least two, three, four, five or six turns greater than 45°. In the embodiment illustrated in FIG. 4, the labyrinthine flow path 250 has four turns greater than 45° as the shortest flow path from the process region 205 to the outside of the heater assembly 200. The Figures show schematic views of the heater assembly 200 with the labyrinthine flow path 250 in which the top 206 and sidewall 204 of the heater assembly 200 are not contacting. However, the skilled artisan will recognize that the views illustrated show one slice of the heater assembly 200 and that other portions of the heater assembly 200 have a top 206 that extends down to the sidewall 204 (or sidewall 204 that extends upward to the top 206) so that the top 206 rests on the sidewall 204. The labyrinthine flow path 250 of some embodiments has a plurality of openings 209 spaced around the periphery of the sidewall 204.

Referring back to FIGS. 1 and 2, some embodiments of the process chamber 100 includes a steam injection port 180. The steam injection port 180 provides a fluid path 181 into the process region 205 of the heater assembly 200. In some embodiments, the steam injection port 180 is in the bottom 108 of the chamber body 102. In some embodiments, the steam injection port 180 is in the sidewall 106 of the chamber body 102. Some embodiments of the process chamber 100 include a steam source 185 in fluid communication with the interior (process region 205) of the heater assembly 200 through a fluid path 181 and steam injection port 180. In some embodiments, the steam source 185 comprises a boiler 186 in fluid communication with the steam injection port 180. In some embodiments, the steam source 185 includes a condenser 187 connected to the boiler 186 which is in fluid communication with the steam injection port 180.

Additional embodiments of the disclosure are directed to methods for annealing a plurality of wafers. A plurality of wafers 131 are positioned in a heater assembly 200 within the lower interior region 120 of the chamber body 102. To position the wafers 131 in the heater assembly 200, a wafer cassette 300 is moved from a process position, shown in FIG. 1, to a plurality of loading positions, as shown in FIGS. 5A through 5H. In FIG. 5A, the wafer cassette 300 has been lifted from a resting or process position to position to load the first wafer 131. In the illustrated embodiment, the top 206 of the heater assembly 200 is lifted by the wafer cassette 300.

Figure 5B:
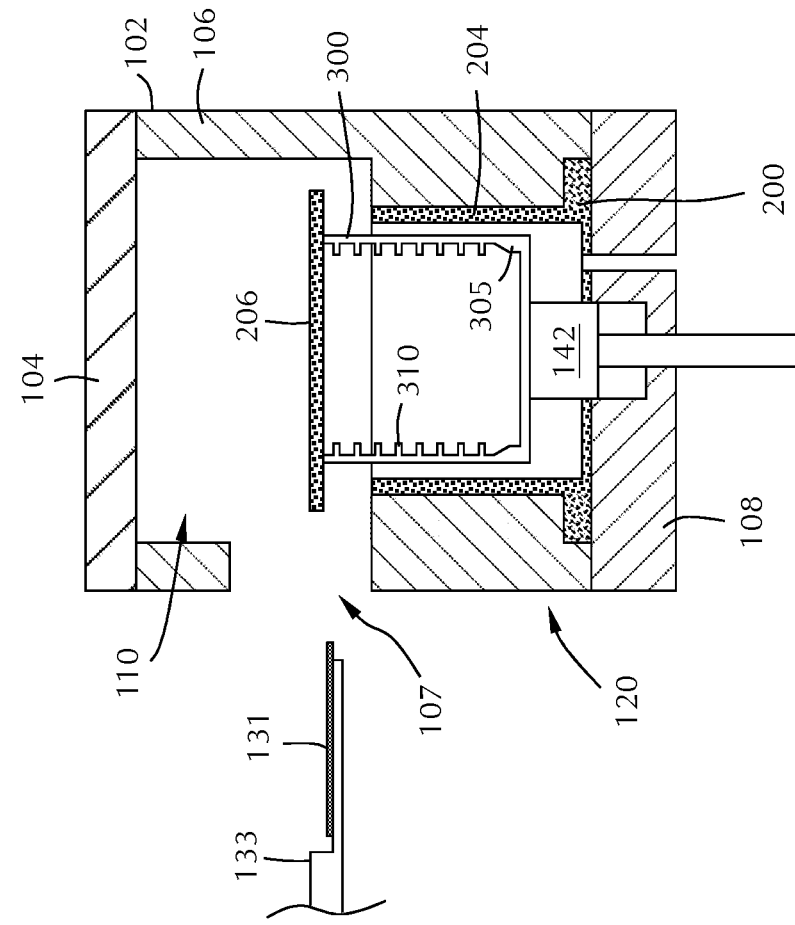

As shown in FIG. 5B, the robot 133 moves through slit valve 107 and passes the wafer 131 past the wafer supports 305 of the wafer cassette 300. The robot 133 positions the wafer 131 above the wafer support element 310 and either the robot 133 lowers to position the wafer 131 on the wafer support element 310, or the wafer cassette 300 is elevated to lift the wafer 131 off of the robot 133.

Figure 5D:
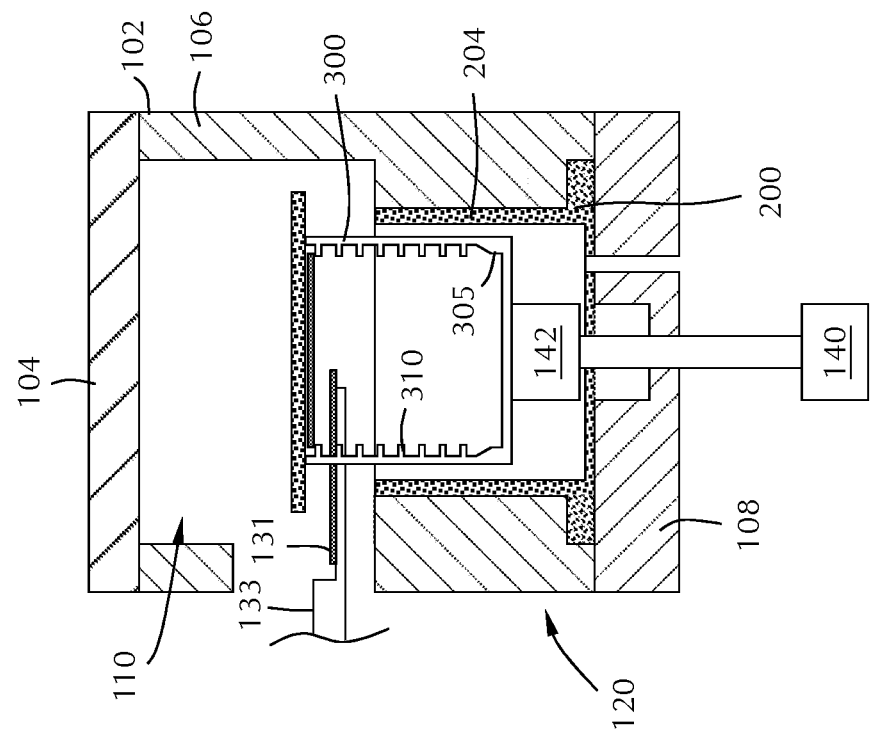
Figure 5C:
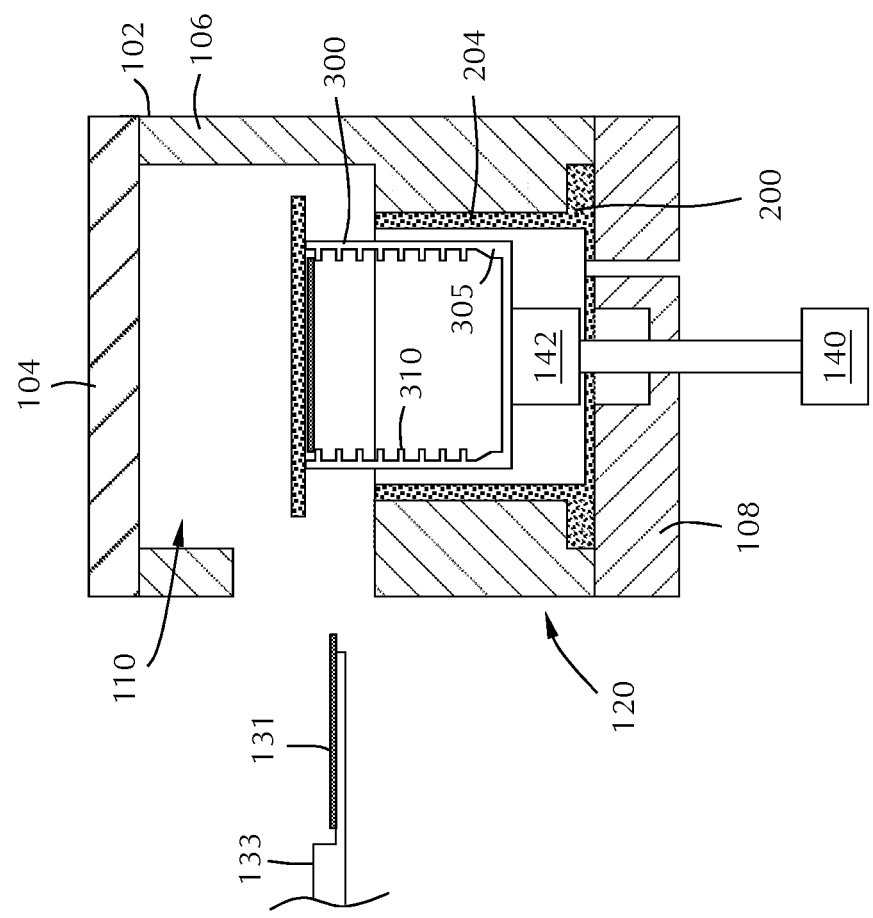

FIG. 5C shows the loading process after the robot 133 has retracted through the slit valve 107 and picked up another wafer 131, and the wafer cassette has been elevated further to align another set of wafer support elements 310 for loading. FIG. 5D shows the loading the second wafer 131 on the next set of wafer support elements 310.

Figure 5F:
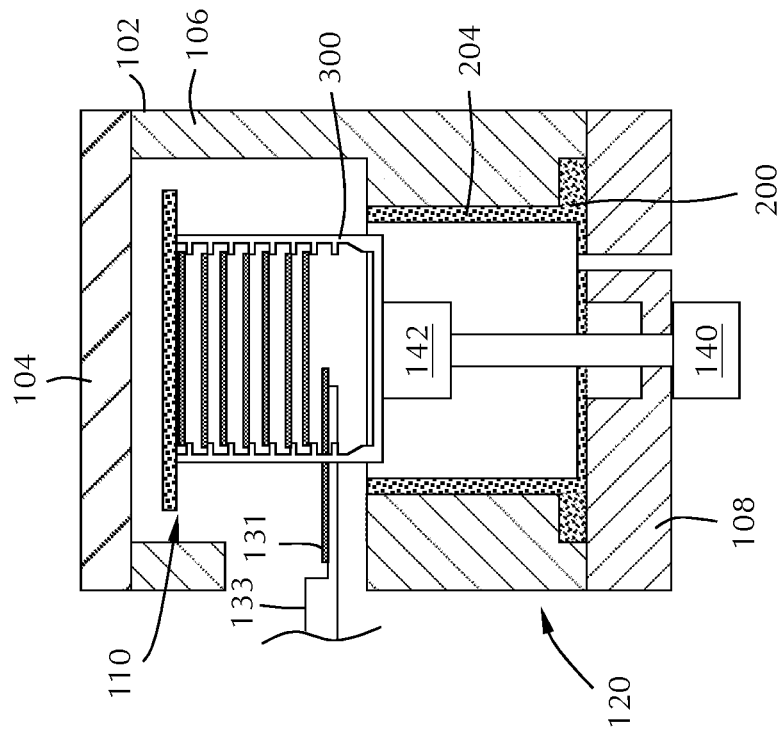
Figure 5E:
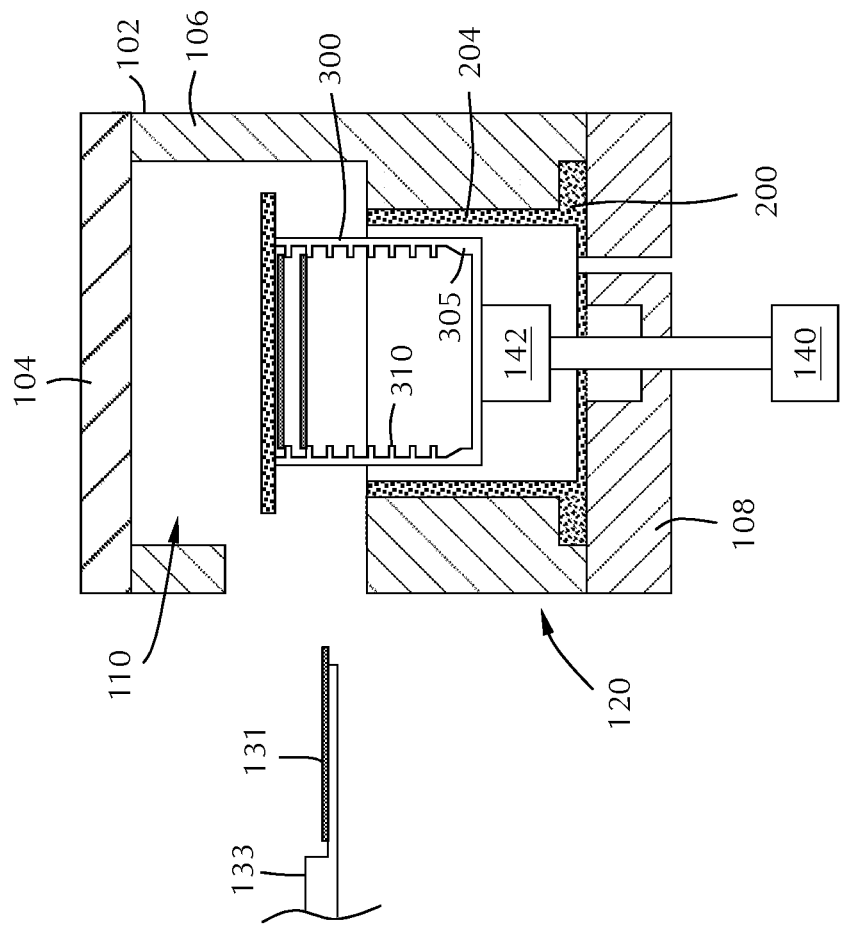
Figure 5G:
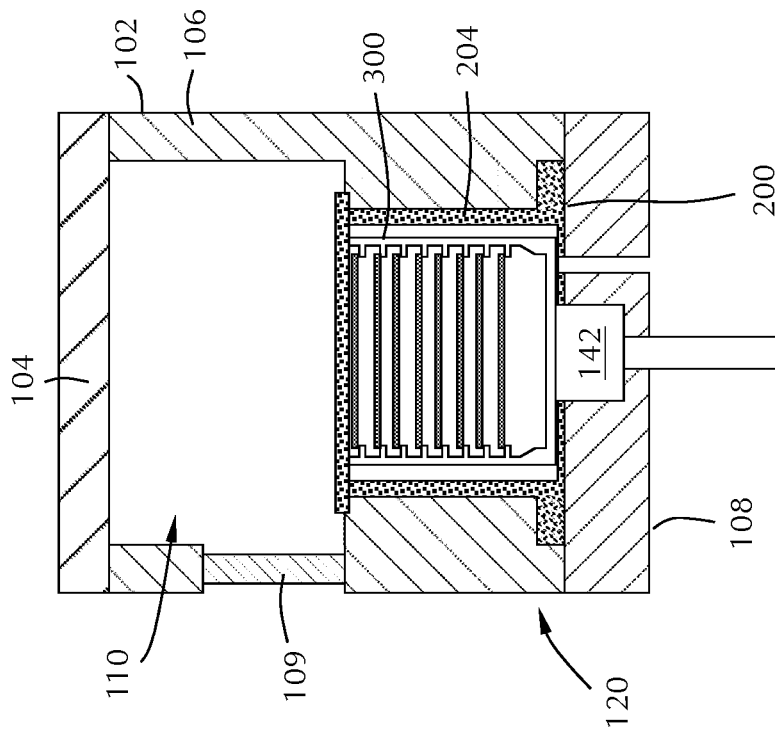
Figure 5H:
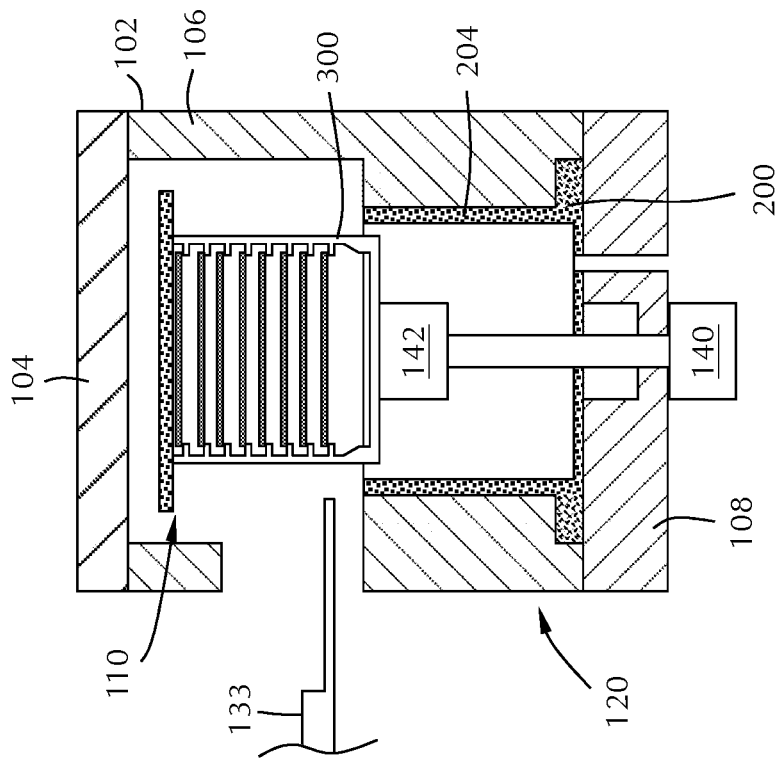

FIG. 5E shows the loading process similar to FIG. 5C after a second wafer 131 has been loaded and a new wafer has been picked up by the robot 133. The cycle of loading wafers, lifting the wafer cassette 300 and retracting the robot 133 is repeated until a predetermined number of wafers are on the wafer support elements 310 of the wafer cassette 300. FIG. 5F shows the loading of the final wafer onto the bottom set of wafer support elements 310. FIG. 5G shows the fully loaded wafer cassette 300 in the elevated position in the upper interior region 110 of the process chamber 100 and the robot 133 is being withdrawn through the slit valve 107. FIG. 5H shows the fully loaded wafer cassette 300 in the lower interior region 120 of the process chamber 100 forming the mini-environment. The slit valve 107 is closed with slit valve door 109 to isolate the upper interior region 110 (except with the lower interior region 120).

The wafer loading process described in FIGS. 5A through 5G started with the top-most wafer being loaded first and the wafer cassette 300 being lifted for each wafer. In some embodiments, the wafer loading process starts with the bottom-most wafer being loaded first. In this embodiment, the wafer cassette 300 is lifted completely out of the lower interior region 120 first and then lowered into the lower interior region 120 with each successive wafer 131 being loaded. The unloading process is a reverse of the loading process. In some embodiments, the loading and unloading processes are mixed so that a wafer is removed from the wafer cassette and replaced with a new wafer before moving the wafer cassette to the next loading/unloading position. In some embodiments, a dual blade robot is used so that a first blade picks up the processed wafer from the wafer cassette and a second blade loads the new wafer onto the same set of wafer support elements.

Figure 6:
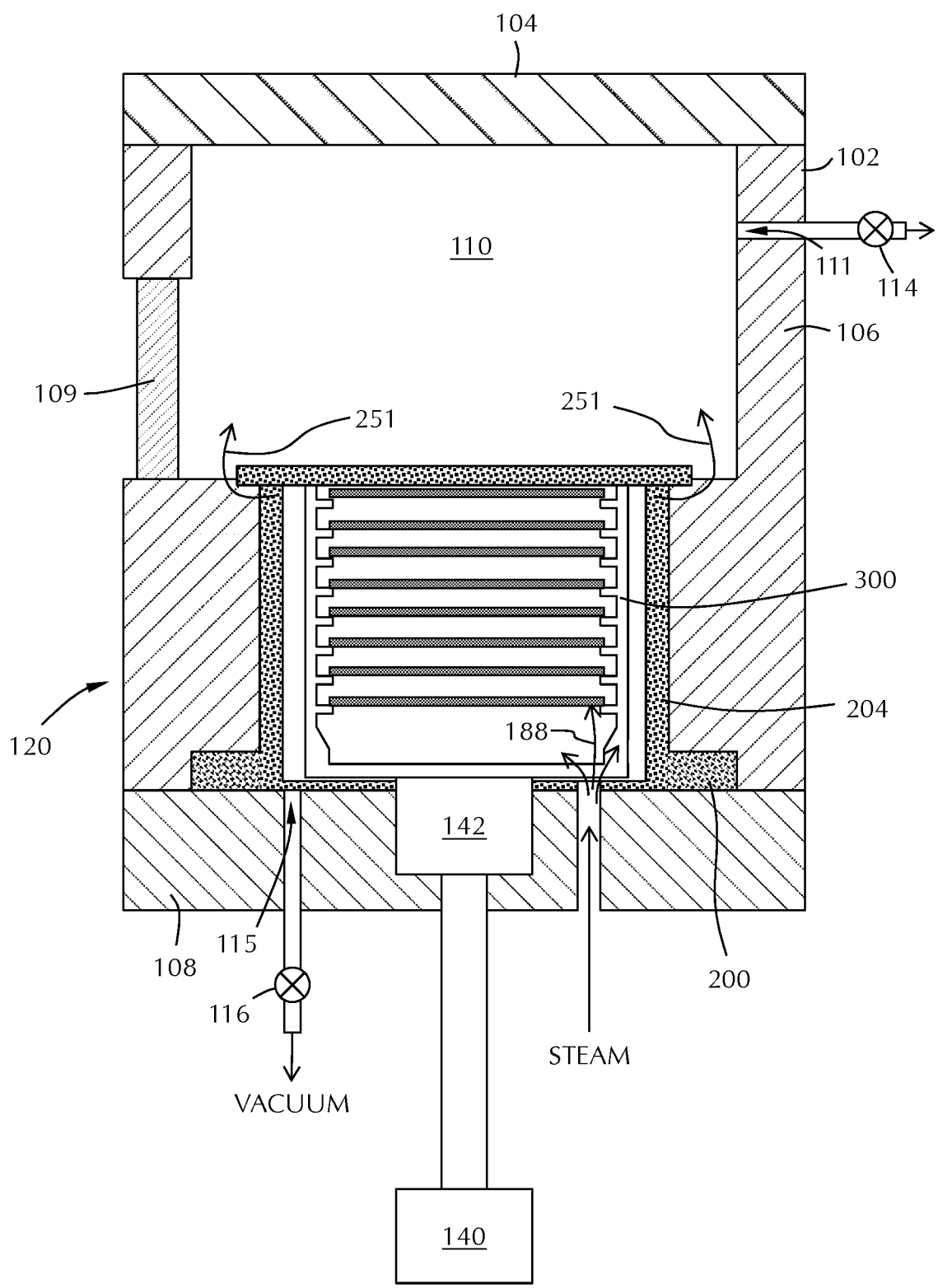
FIG. 6 shows a cross-sectional schematic view of a processing chamber with mini environment in use showing gas flow paths according to one or more embodiment of the disclosure.

With reference to FIG. 6, an annealing process is described. The plurality of wafers 131 on the wafer cassette 300 in the lower interior region 120 of the process chamber 100 are heated using one or more of the bottom heater(s) or sidewall heater(s), as described above. In some embodiments, the lower interior region 120 of the process chamber 100 is heated to a temperature greater than or equal to about 500° C., 550° C., 600° C., 650° C., 700° C., 750° C., 800° C., 850° C. or 900° C.

In some embodiments, when the lower interior region 120 of the process chamber has been heated to processing temperatures, the upper interior region 110 of the process chamber 100 maintains a lower temperature than lower interior region 120. In some embodiments, the temperature in the lower interior region 120 is greater than or equal to about 25° C., 50° C., 75° C., 100° C., 125° C., 150° C., 175° C., 200° C., 225° C., 250° C., 275° C., 300° C., 325° C., 350° C., 375° C., 400° C., 450° C. or 500° C. than the upper interior region 110.

The chamber body 102 is pressurized to a predetermined pressure by flowing steam 188 into the heater assembly 200 through steam injection port 180. In some embodiments, the steam 188 pressurizes the heater assembly 200 to a pressure greater than or equal to about 50 bar, 60 bar, 70 bar, 80 bar, 90 bar or 100 bar.

In some embodiments, the pressure within the heater assembly 200 within the lower interior region 120 and the upper interior region 110 are approximately the same. As used in this manner, the term "approximately the same" means that there is less than or equal to about a 5%, 2% or 1% absolute difference in pressures in the lower interior region 120 relative to the upper interior region 110. In some embodiments, when the lower interior region 120 of the process chamber has been pressurized, the upper interior region 110 of the process chamber 100 maintains a lower pressure than lower interior region 120. In some embodiments, the pressure in the upper interior region 110 is greater than or equal to about 10 bar, 20 bar, 30 bar, 40 bar, 50 bar or 60 bar lower than the pressure in the lower interior region 120.

While pressurized, steam flow 251 exits the heater assembly 200 into the upper interior region 110 of the chamber body 102 through the double-walled labyrinthine exit flow path 250 in the heater assembly 200. The flow rate of gases exiting the lower interior region 120 through the labyrinthine exit flow path 250 is lower than the flow rate of steam entering the lower interior region 120. The upper interior region 110 of the process chamber 100 is connected to a vacuum source through a vacuum port 111 to evacuate the upper interior region 110 maintaining a suitable pressure in the upper interior region 110.

The elevated temperature and pressure in the lower interior region 120 is maintained for a predetermined period of time. Once the predetermined period of time has elapsed, steam is no longer added to the lower interior region 120 and the pressure in the lower interior region 120 is allowed to dissipate. In some embodiments, the pressure in the lower interior region 120 dissipates through the labyrinthine exit flow path 250 only. In some embodiments, the pressure in the lower interior region 120 is lowered by use of a vacuum source connected to the lower interior region 120 through a vacuum port 115. In some embodiments, a vacuum valve 116 is opened and closed to isolate the lower interior region 120 from the vacuum source. In some embodiments, the vacuum port is the same as the steam injection port 180 so that the vacuum source is connected to the same port as the steam source with a suitable valve to switch between the steam source and the vacuum source.

Referring again to FIG. 1, additional embodiments of the disclosure are directed to a processing chamber 100 for executing the methods described herein. Some embodiments of the processing chamber 100 include at least one controller 190 coupled to one or more of the motor 140, heating element 210, heating element 220, steam source 185, slit valve door 109, robot 133, sensor 130 or vacuum valve 116 (shown in FIG. 6). In some embodiments, there are more than one controller 190 connected to the individual components and a primary control processor is coupled to each of the separate processors to control the processing chamber 100. The controller 190 may be one of any form of general-purpose computer processor, microcontroller, microprocessor, etc., that can be used in an industrial setting for controlling various chambers and sub-processors. In some embodiments, the controller 190 is connected to one or more of the heater assembly, the wafer cassette, the motor, an opening in the sidewall of the chamber in the upper interior region or one or more sensors within the upper interior region to measure one or more of temperature or pressure.

The at least one controller 190 of some embodiments has a processor 192, a memory 194 coupled to the processor 192, input/output devices 196 coupled to the processor 192, and support circuits 198 to communication between the different electronic components. The memory 194 of some embodiments includes one or more of transitory memory (e.g., random access memory) or non-transitory memory (e.g., storage).

The memory 194, or computer-readable medium, of the processor of some embodiments is one or more of readily available memory such as random access memory (RAM), read-only memory (ROM), floppy disk, hard disk, or any other form of digital storage, local or remote. The memory 194 of some embodiments retains an instruction set that is operable by the processor 192 to control parameters and components of the processing chamber 100. The support circuits 198 are coupled to the processor 192 to support the processor 192 in a conventional manner. Suitable circuits include, but are not limited to, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 190 has one or more configurations to execute individual processes or sub-processes to perform the method. The controller 190 of some embodiments is connected to and configured to operate intermediate components to perform the functions of the methods. For example, the controller 190 of some embodiments is connected to and configured to control one or more of gas valves, actuators, motors, slit valves, vacuum control, etc.

The controller 190 of some embodiments has one or more configurations selected from: a configuration to control a robot 133 to move a wafer 131; a configuration to control the motor 140 to raise and/or lower the wafer cassette 300; a configuration to load and/or unload substrates from the processing chamber; a configuration to operate one or more of bottom heating element 210 or sidewall heating element 220; a configuration to control pressurization of the lower interior region 120 with steam; a configuration to control the steam source 185; a configuration to read data from the at least one sensor 130; a configuration to control steam source 185 and/or vacuum valve 116 in response to data from the at least one sensor 130; a configuration to control the vacuum valve 114 to control the pressure in the upper interior region 110; and a configuration to control the vacuum valve 116 to control the pressure in the lower interior region 120.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of annealing a plurality of wafers, the method comprising:
positioning the plurality of wafers in a heater assembly within a lower interior portion of a chamber body, the heater assembly comprising a sidewall with a double-walled labyrinthine exit flow path to provide fluid communication between an interior of the heater assembly and an upper interior portion of the chamber body, the chamber body including a steam source in fluid communication with the interior of the heating assembly through a steam injection port;
heating the plurality of wafers; and
pressurizing the chamber body to a predetermined pressure by flowing steam into the heater assembly through the steam injection port, wherein the steam injection port provides a fluid path into the interior of the heater assembly and the double-walled labyrinthine exit flow path defining an exit flow path of steam from the interior of the heater assembly into the upper interior portion of the chamber body through the double-walled labyrinthine exit flow path in the heater assembly.

2. The method of claim 1, wherein the heater assembly further comprises a heating element adjacent a bottom of the heater assembly.

3. The method of claim 2, wherein there is more than one heating element adjacent the bottom of the heater assembly.

4. The method of claim 3, wherein the heating elements adjacent the bottom of the heater assembly are separated into a plurality of radial zones.

5. The method of claim 1, wherein the heating assembly further comprises a heating element around the sidewall.

6. The method of claim 5, wherein the heating element is located within an interior of the heating assembly.

7. The method of claim 6, wherein there are at least two heating elements adjacent the sidewall of the heater assembly within the interior of the heater assembly.

8. The method of claim 7, wherein the heating elements adjacent the sidewall of the heater assembly is separated into a plurality of axial zones.

9. The method of claim 5, wherein the heating element is positioned on a ceramic wire guide adjacent the sidewall in the interior of the heating assembly.

10. The method of claim 2, wherein the steam injection port is in the lower interior portion of the chamber body and the bottom of the heater assembly.

11. A non-transitory computer readable medium including instructions, that, when executed by a controller of a processing system, cause the processing system to anneal a plurality of wafers, by:
positioning the plurality of wafers in a heater assembly within a lower interior portion of a chamber body, the heater assembly comprising a sidewall with a double-walled labyrinthine exit flow path to provide fluid communication between an interior of the heater assembly and an upper interior portion of the chamber body, the chamber body comprising a steam source in fluid communication with the interior of the heating assembly through a steam injection port;
heating the plurality of wafers; and
pressurizing the chamber body to a predetermined pressure by flowing steam into the heater assembly through the steam injection port, wherein the steam injection port provides a fluid path into the interior of the heater assembly and the double-walled labyrinthine exit flow path defining an exit flow path of the steam from the interior of the heater assembly into the upper interior portion of the chamber body through the double-walled labyrinthine exit flow path in the heater assembly.

* * * * *